US012647061B2

(12) United States Patent
Gauthier

(10) Patent No.: US 12,647,061 B2
(45) Date of Patent: Jun. 2, 2026

(54) THREE-DIMENSIONAL PHOTOVOLTAIC MODULE

(71) Applicant: Sylvain Gauthier, Éze (FR)

(72) Inventor: Sylvain Gauthier, Éze (FR)

( * ) Notice: Subject to any disclaimer, the term of this patent is extended or adjusted under 35 U.S.C. 154(b) by 0 days.

(21) Appl. No.: 18/687,482

(22) PCT Filed: Dec. 27, 2022

(86) PCT No.: PCT/FR2022/052508
§ 371 (c)(1),
(2) Date: Feb. 28, 2024

(87) PCT Pub. No.: WO2023/126611
PCT Pub. Date: Jul. 6, 2023

(65) Prior Publication Data
US 2024/0356482 A1 Oct. 24, 2024

(30) Foreign Application Priority Data
Dec. 30, 2021 (FR) ..................................... 21/14686

(51) Int. Cl.
*H02S 20/10* (2014.01)
*H10F 77/30* (2025.01)

(52) U.S. Cl.
CPC ........... *H02S 20/10* (2014.12); *H10F 77/315* (2025.01)

(58) Field of Classification Search
CPC ........ H02S 20/10; H02S 30/00; H10F 77/315; Y02E 10/50
See application file for complete search history.

(56) References Cited

U.S. PATENT DOCUMENTS

| | | | |
|---|---|---|---|
| 2009/0242019 A1* | 10/2009 | Ramamoorthy .... | H10F 77/1698 136/258 |
| 2011/0083718 A1 | 4/2011 | Wichner | |
| 2014/0182650 A1* | 7/2014 | Lochun ................. | H10F 77/939 136/258 |
| 2018/0240923 A1* | 8/2018 | Clark .................... | H10F 77/488 |

FOREIGN PATENT DOCUMENTS

| | | |
|---|---|---|
| CN | 203071100 U | 7/2013 |
| WO | 2020153534 A1 | 7/2020 |

OTHER PUBLICATIONS

International Search Report for corresponding application PCT/FR2022/052508 filed Dec. 27, 2022; Mail date Mar. 31, 2023.

* cited by examiner

*Primary Examiner* — Michael Y Sun
(74) *Attorney, Agent, or Firm* — CANTOR COLBURN LLP

(57) ABSTRACT
The three-dimensional photovoltaic module includes a three-dimensional support structure including a central axis and a plurality of support elements distributed around the central axis, each support element including a vertex and two support faces which are substantially planar and which are connected to each other along a ridge line inclined with respect to the central axis and extending up to the vertex of the respective support element while getting away from the central axis; and a plurality of photovoltaic coatings fastened to the three-dimensional support structure, each photovoltaic coating being arranged on a respective support face and extending substantially parallel to the latter, each photovoltaic coating comprising at least one photovoltaic cell and covering at least partially the respective support face.

14 Claims, 3 Drawing Sheets

THREE-DIMENSIONAL PHOTOVOLTAIC MODULE

TECHNICAL FIELD

The present disclosure generally relates to the field of photovoltaic solar energy. More specifically, it concerns a three-dimensional photovoltaic module.

BACKGROUND

In the field of photovoltaic solar energy, it is known to use, in general, two-dimensional photovoltaic panels constituted by the superposition of several layers generally consisting from top to bottom of:

an antireflective coating to limit the reflection of solar rays on the underlying semiconductor layers;

a protective glass layer to protect the underlying semiconductor layers;

a conductive grid;

a N or P doped semiconductor layer;

a P or N doped semiconductor layer; and a base layer.

The major drawback of this type of photovoltaic panels lies in the low amount of energy produced per m². Indeed, with a two-dimensional photovoltaic panel, the amount of energy produced per m² is not optimized.

In addition, this type of photovoltaic panel does not have a uniform energy production throughout the day. Indeed, this production follows a Gaussian law, maximum when the Sun is at its highest point, and lower the rest of the day and in particular at the beginning and end of the day.

Moreover, the classic solution requires orienting the photovoltaic panel optimally with respect to solar radiation, which is not always easy depending on the configuration of the building receiving such a photovoltaic panel.

To overcome such drawbacks, it is known to make a three-dimensional photovoltaic module including:

a three-dimensional support structure having a pyramidal shape with a square base, and comprising four support faces each having a triangular shape; and a plurality of photovoltaic coatings fastened to the three-dimensional support structure, each photovoltaic coating being arranged on a respective support face and extending substantially parallel to the respective support face, each photovoltaic coating comprising at least one photovoltaic cell and covering at least partially the respective support face.

Such a configuration of the three-dimensional photovoltaic module allows increasing the developed surface covered with active photovoltaic material, and therefore producing, when the Sun is at its culmination point and the three-dimensional photovoltaic module is arranged on a horizontal surface, more energy per unit area than a conventional photovoltaic panel.

However, because of the shadows generated by the three-dimensional support structure over the Sun's course throughout a day, the amount of energy produced annually by such a three-dimensional photovoltaic module is not optimal. In addition, at some time points of the Sun's course, some of the photovoltaic coatings are not insulated and generate resistive loads which oppose the energy provided by the insulated photovoltaic coatings, which further limits the amount of energy produced annually by such a three-dimensional photovoltaic module.

Furthermore, when a plurality of three-dimensional photovoltaic modules of the aforementioned type are assembled together to form a photovoltaic device, each three-dimensional support structure generates, over the course of the Sun, shadows, even darkness, on the photovoltaic coatings of the adjacent three-dimensional photovoltaic modules, which therefore considerably limits the amount of energy produced annually by such a photovoltaic device.

BRIEF SUMMARY

The present disclosure aims to overcome the aforementioned draw backs.

Hence, the technical problem at the origin of the disclosure consists in providing a three-dimensional photovoltaic module allowing producing more energy per unit area annually than a conventional three-dimensional photovoltaic module.

To this end, the present disclosure relates to a three-dimensional photovoltaic module including:

a three-dimensional support structure including a central axis and a plurality of support elements distributed around the central axis of the three-dimensional support structure, each support element including a vertex and two support faces which are substantially planar and which are connected to each other along a ridge line, the ridge line of each of the support elements being inclined with respect to the central axis of the three-dimensional support structure and extending up to the vertex of the respective support element while getting away from the central axis of the three-dimensional support structure, a plurality of photovoltaic coatings fastened to the three-dimensional support structure, each photovoltaic coating being arranged on a respective support face and extending substantially parallel to the respective support face, each photovoltaic coating comprising at least one photovoltaic cell and covering at least partially the respective support face.

Such a configuration of the three-dimensional support structure, and therefore of the orientation of the different photovoltaic coatings, allows maximizing the insulated surface of the three-dimensional photovoltaic module at each point of the Sun's course, and therefore capturing an amount of significant energy originating from the Sun, and that being so without requiring any movement mechanism configured to modify the orientation of the three-dimensional photovoltaic module according to the position of the Sun.

In particular, the arrangement of the support elements limits the phenomenon of cast shadows generated by each support element on the other support elements of the three-dimensional support structure, and therefore on the photovoltaic coatings arranged on the support faces of the other support elements of the three-dimensional support structure, while enabling a good light penetration within the three-dimensional photovoltaic module.

In addition, given the arrangement of the support elements, and therefore the support faces, all the photovoltaic coatings are at least partially simultaneously insulated over a significant portion of the Sun's course, which ensures better regularity of the production of energy throughout a day (and in particular during the ascending and descending phases of the Sun) and therefore also throughout the year. The arrangement of the support elements also allows producing electricity earlier in the day and until later in the day compared to the three-dimensional photovoltaic modules of the prior art.

Furthermore, when a photovoltaic coating is not directly insulated (due to the own shadow generated by the respective support element), it is nevertheless capable of capturing at least part of the light reflected by photovoltaic coatings provided on other support elements. In other words, the three-dimensional photovoltaic module according to the present disclosure considerably limits the risks of darkness generated by each support element on the photovoltaic coatings arranged on the support faces of the other support elements. Finally, even when a photovoltaic coating provided on a support element is neither directly nor indirectly insulated, this represents only a small part of the photovoltaic coatings belonging to the three-dimensional photovoltaic module which is not insolated.

Consequently, the three-dimensional photovoltaic module allows producing, not only instantaneously, but above all annually, more energy per unit area than a conventional photovoltaic panel and also than a conventional three-dimensional photovoltaic module.

The three-dimensional photovoltaic module may further have one or more of the following features, considered alone or in combination.

According to an embodiment of the disclosure, the ratio of the developed surface of the support faces of the support elements to the surface on the ground occupied by the three-dimensional photovoltaic module is greater than 3, and for example comprised between 4 and 6, and advantageously between 4.5 and 5.5. These arrangements ensure a relatively high energy production, per unit area, compared to the energy produced, per unit area, by a three-dimensional photovoltaic module of the prior art.

According to an embodiment of the disclosure, the central axis of the three-dimensional support structure is configured to extend substantially vertically when the three-dimensional photovoltaic module is arranged on a horizontal surface.

According to an embodiment of the disclosure, the photovoltaic coatings of said plurality of photovoltaic coatings are distinct from each other and are connected in series and/or in parallel.

According to another embodiment of the disclosure, at least one photovoltaic coating, and for example each of the photovoltaic coatings, of said plurality of photovoltaic coatings is flexible.

According to an embodiment of the disclosure, each photovoltaic coating comprises a plurality of photovoltaic cells connected in parallel and/or in series.

According to an embodiment of the disclosure, the vertices of the support elements are distributed, and for example evenly distributed, around the central axis of the three-dimensional support structure.

According to an embodiment of the disclosure, the vertices of the support elements are equidistant from the central axis of the three-dimensional support structure. In other words, the vertices of the support elements are arranged on a circle centered on the central axis of the three-dimensional support structure.

According to an embodiment of the disclosure, the ridge lines are secant at an intersection point located substantially on the central axis of the three-dimensional support structure.

According to an embodiment of the disclosure, each ridge line is rectilinear.

According to an embodiment of the disclosure, the ridge lines are evenly distributed around the central axis of the three-dimensional support structure.

According to an embodiment of the disclosure, each of the ridge lines is inclined with respect to the central axis by an angle of inclination comprised between 10 and 40°, advantageously between 20 and 30°, and for example around 26°.

According to an embodiment of the disclosure, each of the support faces has a generally triangular shape.

According to an embodiment of the disclosure, each support face includes a first edge extending along the respective ridge line, a second edge extending up to the vertex of the respective support element and a third edge opposite to the vertex of the respective support element. Advantageously, the second edge of each support face has an end which is opposite to the respective vertex and which is closer to the central axis than the respective vertex.

According to an embodiment of the disclosure, the second edge of each support face is inclined with respect to the central axis of the three-dimensional support structure, such that the end of said second edge, which is opposite to the respective vertex, is closer to the central axis than the respective vertex.

According to an embodiment of the disclosure, each support face of each support element is inclined, with respect to a respective reference plane which is parallel to the central axis and which passes through the third edge of said support face, with an angle of inclination comprised between 5 and 10°, and for example around 7°.

According to an embodiment of the disclosure, the first edge of each support face has a length comprised between 35 and 55 mm, and advantageously between 40 and 50 mm, and for example around 44 mm.

According to an embodiment of the disclosure, the second edge of each support face has a length comprised between 55 and 75 mm, and advantageously between 60 and 70 mm, and for example around 65 mm.

According to an embodiment of the disclosure, the third edge of each support face has a length comprised between 25 and 45 mm, and advantageously between 30 and 40 mm, and for example around 34 mm.

According to an embodiment of the disclosure, the number of support elements is comprised between 3 and 6.

According to an embodiment of the disclosure, for each pair of adjacent support elements of the three-dimensional support structure, the adjacent support faces of the two adjacent support elements are located opposite each other.

According to an embodiment of the disclosure, for each pair of adjacent support elements of the three-dimensional support structure, the adjacent support faces of the two adjacent support elements are connected to each other along a connection area which is inclined with respect to the central axis of the three-dimensional support structure and which extends downwards while getting away from the central axis of the three-dimensional support structure.

According to an embodiment of the disclosure, all the support faces of the support elements have different orientations.

According to an embodiment of the disclosure, the two support faces of each support element are symmetrical with respect to a respective plane of symmetry passing through the respective ridge line.

According to an embodiment of the disclosure, the planes of symmetry of the support elements are secant according to an intersection line which is substantially coincident with the central axis of the three-dimensional support structure.

According to an embodiment of the disclosure, each support element has a plane of symmetry passing through the respective ridge line.

According to an embodiment of the disclosure, each support element has, seen from above, a triangular shape, and for example an equilateral triangular shape. In other words, an orthogonal projection of all points of a support element on a reference plane perpendicular to the central axis of the three-dimensional support structure defines a triangular shaped surface, and preferably an equilateral triangular shape.

According to an embodiment of the disclosure, a ratio of the first edge of each support face to one side of the equilateral triangular shape is comprised between 1.7 and 2.2, advantageously between 1.8 and 2, and for example between 1.90 and 1.95.

According to an embodiment of the disclosure, a ratio of the second edge of each support face to one side of the equilateral triangular shape is comprised between 2.7 and 3, advantageously between 2.8 and 2.9, and for example around 2.86.

According to an embodiment of the disclosure, a ratio of the third edge of each support face to one side of the equilateral triangular shape is comprised between 1.2 and 1.8, advantageously between 1.3 and 1.7, and still advantageously between 1.4 and 1.6. According to an embodiment of the disclosure, a ratio of the height of the three-dimensional photovoltaic module to one side of the equilateral triangular shape is comprised between 2.5 and 3.5, advantageously between 2.8 and 3.3, and by example between 3 and 3.1.

According to an embodiment of the disclosure, the three-dimensional photovoltaic module further includes a base which is located below the three-dimensional support structure and which defines, at least partially, an inner housing in which electrically-conductive wires, connected to the photovoltaic coatings, are at least partially housed.

According to an embodiment of the disclosure, the base has a polygonal shape, and for example generally hexagonal.

According to an embodiment of the disclosure, the three-dimensional support structure is made in one-piece.

According to an embodiment of the disclosure, the support elements of the three-dimensional support structure are distinct from each other, and the three-dimensional support structure is formed by an assembly of the support elements.

According to an embodiment of the disclosure, the three-dimensional photovoltaic module includes a protective cap, also called encapsulation cap, which covers the photovoltaic coatings, the protective cap being made of a material transparent to light radiation.

According to an embodiment of the disclosure, the protective cap is configured to fill at least partially an inner space located between the support elements.

According to an embodiment of the disclosure, the protective cap is formed by hardening a transparent resin.

According to an embodiment of the disclosure, the three-dimensional photovoltaic module includes an antireflective surface coating arranged on an upper face of the protective cap.

According to an embodiment of the disclosure, the upper face of the protective cap extends substantially perpendicular to the central axis of the three-dimensional support structure.

According to an embodiment of the disclosure, the upper face of the protective cap extends beyond the vertices of the support elements.

According to an embodiment of the disclosure, the three-dimensional photovoltaic module comprises a main positive terminal to which positive terminals of all photovoltaic coatings are electrically connected, and a main negative terminal to which negative terminals of all photovoltaic coatings are electrically connected.

According to an embodiment of the disclosure, the three-dimensional photovoltaic module has a polygonal-shaped cross-section, and for example hexagonal.

According to an embodiment of the disclosure, the three-dimensional photovoltaic module has a height comprised between 3 and 6 cm, and for example around 4 cm. In particular, such a three-dimensional photovoltaic module height is retained when the three-dimensional photovoltaic module is intended for installation on inclined or horizontal roofs. However, the three-dimensional photovoltaic module could have a height much larger than 6 cm for other applications, for example when the three-dimensional photovoltaic module is intended to be installed according to a substantially vertical orientation.

The present disclosure further includes a photovoltaic device including a plurality of three-dimensional photovoltaic modules according to the present disclosure, said three-dimensional photovoltaic modules being arranged adjacently. Advantageously, the photovoltaic device extends according to an extension plan.

According to an embodiment of the disclosure, for each pair of adjacent three-dimensional photovoltaic modules of the photovoltaic device, the bases of the two adjacent three-dimensional photovoltaic modules are juxtaposed, that is to say they are in contact with each other. Advantageously, one side of a base of a three-dimensional photovoltaic module is configured to extend along and to be in contact with one side of a base of an adjacent three-dimensional photovoltaic module.

BRIEF DESCRIPTION OF THE FIGURES

The present disclosure will be better understood from the following description with reference to the appended figures, wherein identical reference signs correspond to structurally and/or functionally identical or similar elements.

FIG. 2 is a perspective top view of a three-dimensional support structure belonging to the three-dimensional photovoltaic module of FIG. 1.

FIG. 3 is a top view of the three-dimensional support structure of FIG. 2 equipped with photovoltaic coatings.

DETAILED DESCRIPTION

Figure 1:
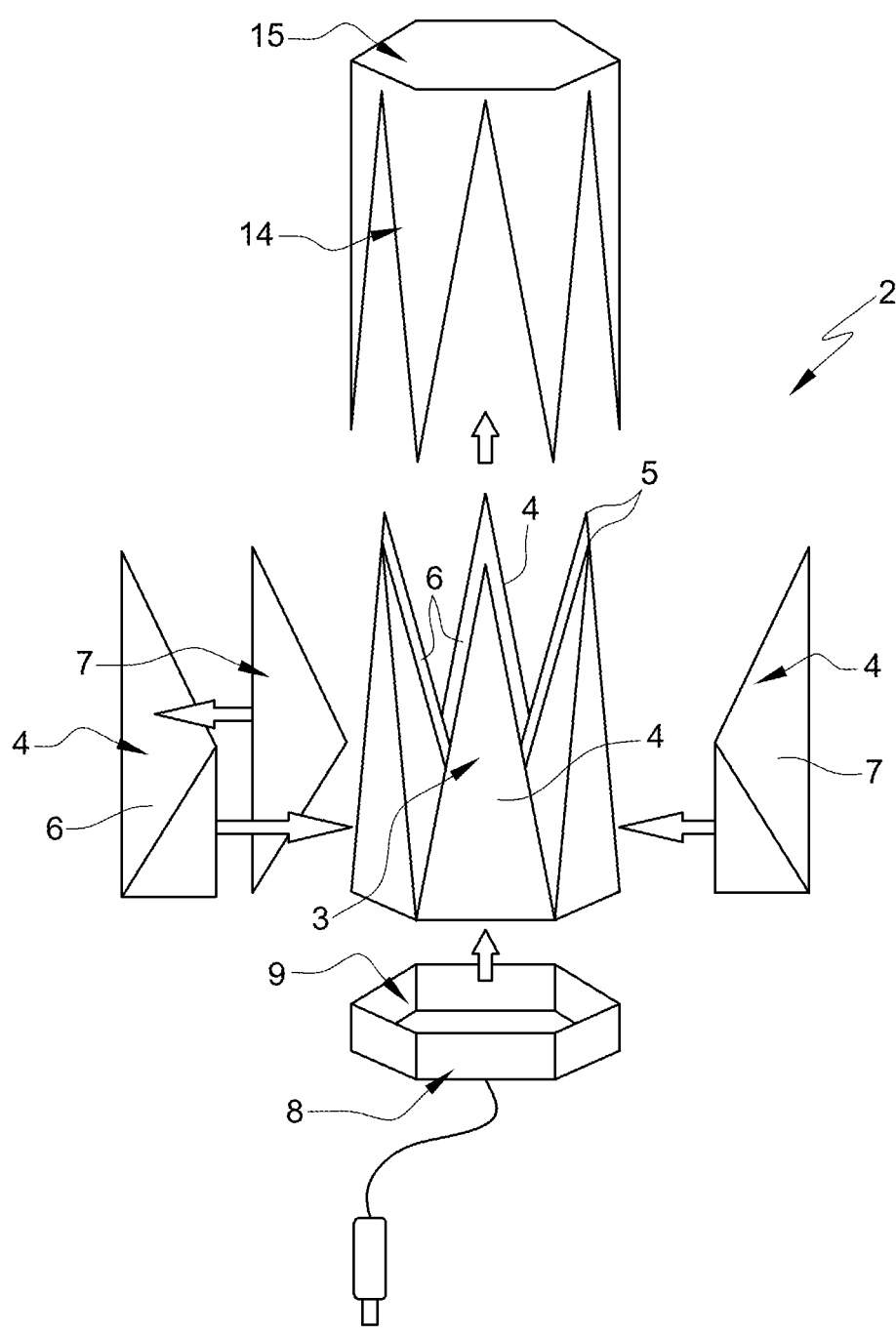
FIG. 1 is an exploded schematic view of a three-dimensional photovoltaic module according to the present disclosure.
Figure 4:
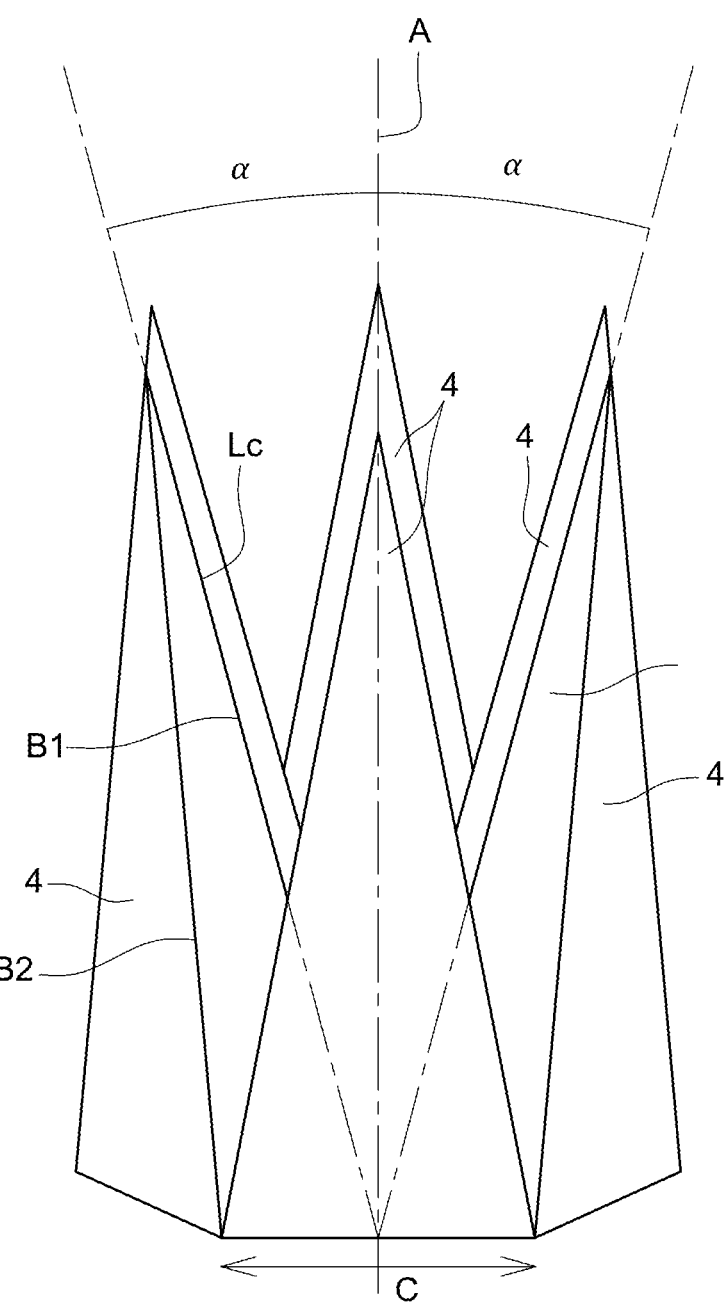
FIG. 4 is a perspective side view of the three-dimensional support structure of FIG. 2.

In the present document, by "photovoltaic coating", it should be understood a photovoltaic element comprising at least one or more photovoltaic cell(s) supported, or not, by a base substrate layer which may for example be flexible or rigid.

FIGS. 1 to 4 represent a three-dimensional photovoltaic module 2 according to an embodiment of the disclosure. Advantageously, the three-dimensional photovoltaic module 2 has a polygonal-shaped cross-section, and for example hexagonal.

The three-dimensional photovoltaic module 2 includes a three-dimensional support structure 3 including a central axis A which is configured to extend vertically when the three-dimensional photovoltaic module 2 is arranged on a horizontal surface.

The three-dimensional support structure 3 includes a plurality of support elements 4 distributed around the central axis A. Advantageously, the number of support elements 4 is comprised between 3 and 6. According to the embodiment represented in the figures, the number of support elements 4 is equal to 6, and each support element 4 has, seen from above, a triangular shape, and for example an equilateral triangular shape. However, a variant of the disclosure, the number of support elements 4 could be equal to 3, 4 or 5.

For example, the three-dimensional support structure 3 may be made in one-piece, and be obtained for example by 3D printing. However, the three-dimensional support structure 3 could also be obtained by assembling a plurality of support elements 4 distinct from each other, that is to say formed independently of each other, for example by 3D printing.

Each support element 4 includes a vertex 5 and two support faces 6 which are substantially planar. Advantageously, all the support faces 6 of the support elements 4 have different orientations. According to an embodiment of the disclosure, the ratio of the developed surface of the support faces 6 of the support elements 4 to the ground surface occupied by the three-dimensional photovoltaic module 2 is greater than 3, and for example comprised between 4 and 6, and advantageously between 4.5 and 5.5.

Figures 2, 3:
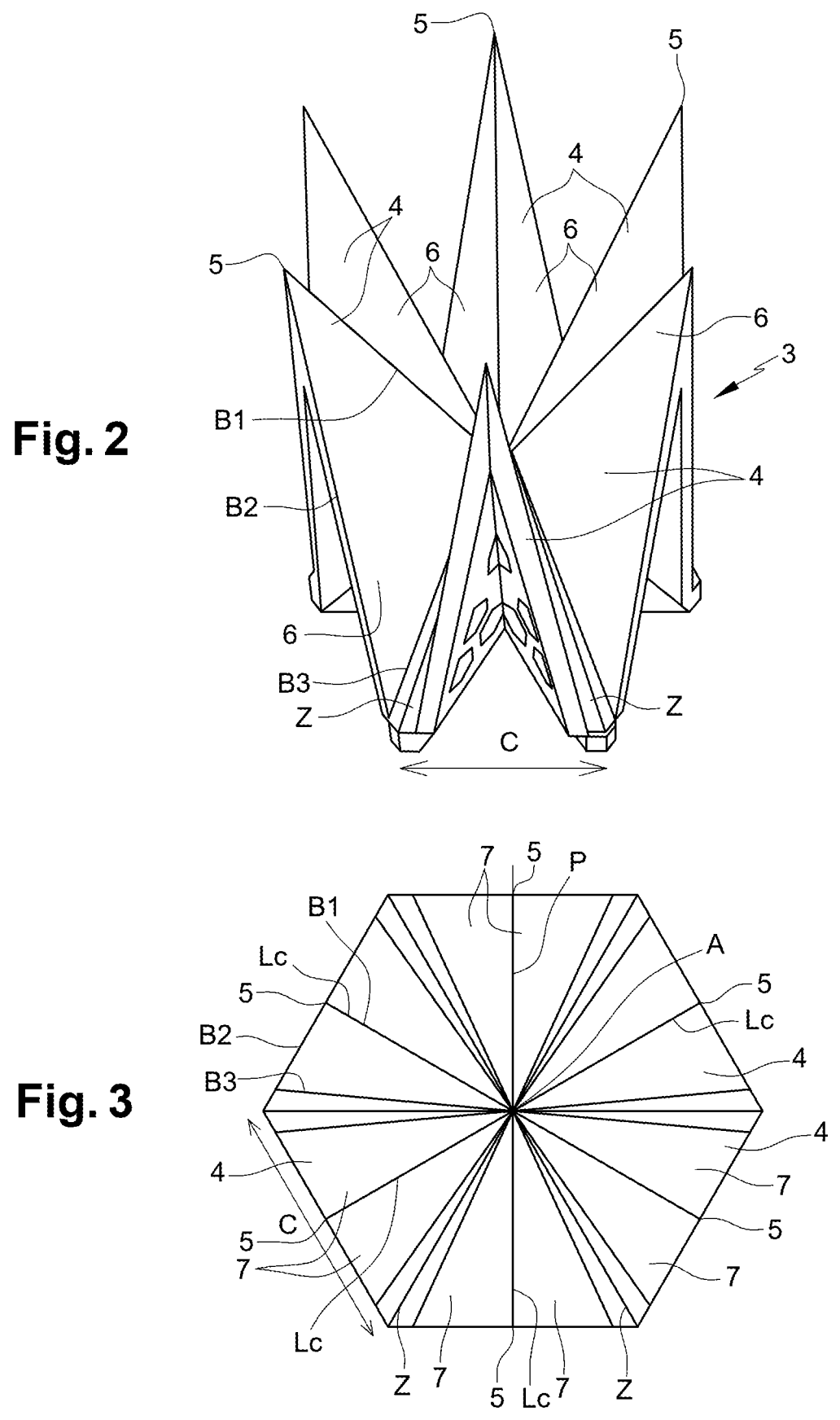

As shown more particularly in FIGS. 2 and 3, the two support faces 6 of each support element 4 are connected to each other along a ridge line Le which is rectilinear. The ridge line Le of each of the support elements 4 is inclined with respect to the central axis A, and extends up to the vertex 5 of the respective support element 4 while getting away from the central axis A.

Advantageously, the ridge lines Le are secant at an intersection point located on the central axis A of the three-dimensional support structure 3, and are evenly distributed around the central axis A. More particularly, each of the ridge lines Le is inclined with respect to the central axis A with an angle of inclination $\alpha$ comprised between 10 and 40°, advantageously between 20 and 30°, and for example around 26°.

According to the embodiment represented in the figures, each of the support faces 6 has a generally triangular shape, and includes a first edge B1 extending along the respective ridge line Le, a second edge B2 extending up to at the vertex 5 of the respective support element 4 and a third edge B3 opposite to the vertex 5 of the respective support element 4. Advantageously, the second edge B2 of each support face 6 is inclined with respect to the central axis A of the three-dimensional support structure 3, such that the end of said second edge B2, which is opposite to the respective vertex 5, is closer to the central axis A than the respective vertex 5.

As shown more particularly in FIG. 2, for each pair of adjacent support elements 4 of the three-dimensional support structure 3, the adjacent support faces 6 of the two adjacent support elements 4 are located opposite one of the other. Advantageously, for each pair of adjacent support elements 4 of the three-dimensional support structure 3, the adjacent support faces 6 of the two adjacent support elements 4 are connected to each other along a connection area Z which is inclined with respect to the central axis A of the three-dimensional support structure 3 and which extends downwards while getting away from the central axis A of the three-dimensional support structure 3. Thus, the third edge B3 of each of the support faces 6 extends along the respective connection area Z.

According to an embodiment of the disclosure:

a ratio of the first edge B1 of each support face 6 to a side C of the equilateral triangular shape (defined by each support element 4 seen from above) is comprised between 1.7 and 2.2, advantageously between 1.8 and 2, still advantageously between 1.90 and 1.95, and for example equal to about 1.94 or about 1.92.

a ratio of the second edge B2 of each support face 6 to a side C of the aforementioned equilateral triangular shape is comprised between 2.7 and 3, advantageously between 2.8 and 2.9, and for example about 2.86.

a ratio of the third edge B3 of each support face 6 to a side C of the aforementioned equilateral triangular shape is comprised between 1.2 and 1.8, advantageously between 1.3 and 1.7, and still advantageously between 1.4 and 1.6, and for example equal to about 1.47 or about 1.58.

a ratio of the height of the three-dimensional photovoltaic module 2 on a side C of the aforementioned equilateral triangular shape is comprised between 2.5 and 3.5, advantageously between 2.8 and 3.3, and still advantageously between 3 and 3.1, and for example equal to about 3.06.

As also shown in FIG. 3, the vertices 5 of the support elements 4 are evenly distributed around the central axis A of the three-dimensional support structure 3, and are equidistant from the central axis A of the three-dimensional support structure 3. In other words, the vertices 5 of the support elements 4 are arranged on a circle centered on the central axis A of the three-dimensional support structure 3.

According to the embodiment represented in the figures, each support element 4 has a plane of symmetry P passing through the respective ridge line Le, and the planes of symmetry P of the support elements 4 are secant according to a line of intersection which coincides with the central axis A of the three-dimensional support structure 3.

Advantageously, each support face 6 of each support element 4 is inclined, with respect to a respective reference plane which is parallel to the central axis A and which passes through the third edge B3 of said support face 6, with an angle of inclination comprised between 5 and 10°, and for example around 7°.

The three-dimensional photovoltaic module 2 further includes a plurality of photovoltaic coatings 7 fastened to the three-dimensional support structure 3. More particularly, each photovoltaic coating 7 is arranged on a respective support face 6, and extends parallel to the respective support face 6. Advantageously, each photovoltaic coating 7 comprises several photovoltaic cells connected in parallel and/or in series, and partially or entirely covers the respective support face 6. For example, the photovoltaic cells of each photovoltaic coating 7 may be supported by a base substrate layer. Advantageously, each photovoltaic coating 7 is generally triangular shaped, and has dimensions substantially identical to those of each support face 6. According to an embodiment of the disclosure, each photovoltaic coating 7 has a thickness of about 1 mm.

According to the embodiment represented in the figures, the photovoltaic coatings 7 of said plurality of photovoltaic coatings are distinct from each other and connected in series and/or in parallel. Advantageously, at least one photovoltaic coating 7, and for example each of the photovoltaic coatings 7, may be flexible.

The three-dimensional photovoltaic module 2 also includes a base 8 which is located below the three-dimensional support structure 3 and which has a polygonal shape, and for example generally hexagonal. The base 8 delimits, at least in part, an inner housing 9 in which electrically-conductive wires, connected to the photovoltaic coatings 7, are at least partially housed. The three-dimensional photovoltaic module 2 further comprises a positive main terminal to which the positive terminals of all photovoltaic coatings 7 are electrically connected, and a negative main terminal to which the negative terminals of all photovoltaic coatings 7 are electrically connected.

As shown in FIG. 1, the three-dimensional photovoltaic module 2 further includes a protective cap 14, also called encapsulation cap, which covers and protects photovoltaic coatings 7. The protective cap 14 is made of a material transparent to light radiation, and is for example formed by hardening a transparent resin. More particularly, the protective cap 14 is configured to fill an inner space located between the support elements 4.

According to the embodiment represented in the figures, the protective cap 14 includes an upper face which extends beyond the vertices 5 of the support elements 4, and which extends perpendicularly to the central axis A of the three-dimensional support structure 3. Advantageously, the protective cap 14 is configured such that the three-dimensional photovoltaic module 2 has a prism-like general shape, each of the bases of which has a generally hexagonal shape.

The three-dimensional photovoltaic module 2 also includes an antireflective surface coating 15 arranged on an upper face of the protective cap 14. Nevertheless, if the protective cap 14 is made of a material having antireflective properties, the three-dimensional photovoltaic module 2 could be devoid of the antireflective surface coating 15.

Several three-dimensional photovoltaic modules 2 according to the present disclosure could be assembled so as to form a photovoltaic device extending according to an extension plane, and therefore having an outer shape similar to that of a conventional photovoltaic panel. To this end, the three-dimensional photovoltaic modules 2 are arranged adjacently, and are connected in series and/or in parallel by connecting their main positive and negative terminals. Advantageously, for each pair of adjacent three-dimensional photovoltaic modules 2 of the photovoltaic device, the bases 8 of the two adjacent three-dimensional photovoltaic modules 2 are juxtaposed, that is to say are in contact with each other, at the level from their adjacent sides. Advantageously, such a photovoltaic device includes a support or support frame delimiting a compartment in which the different three-dimensional photovoltaic modules 2 are arranged.

The fact that the base 8 of each three-dimensional photovoltaic module 2 has a hexagonal shape advantageously allows obtaining an optimized array arrangement of the different three-dimensional photovoltaic modules 2 of said photovoltaic device.

A photovoltaic device according to the present disclosure may be installed in a larger number of locations than a photovoltaic device formed by three-dimensional photovoltaic modules of the prior art, and that being so with less orientation and inclination constraints. In particular, a photovoltaic device according to the present disclosure may be installed on inclined roofs oriented Eastward, Southward or Westward, on horizontal roofs or on the ground without additional support, on facades oriented Eastward, Southward or Westward (and therefore according to a substantially vertical orientation), or as a replacement for all existing photovoltaic devices coated with a photovoltaic material with identical technical characteristics with at least three times more annual electricity production for the same surface.

A photovoltaic device according to the present disclosure may also be installed on all means of locomotion existing to date and to come, and that being so because such a photovoltaic device has an annual energy production at least three times greater than that of photovoltaic devices of the prior art coated with a photovoltaic material with identical technical characteristics and overcomes most of the orientation constraints.

Of course, the present disclosure is in no way limited to the embodiment described and illustrated which has been given merely as example. Modifications are still possible, in particular with regards to the constitution of the various elements or by substitution with technical equivalents, yet without departing from the scope of the disclosure.

The invention claimed is:

1. A three-dimensional photovoltaic module, comprising:
   a three-dimensional support structure including a central axis and a plurality of support elements distributed around the central axis of the three-dimensional support structure, each support element including an apex configured to be oriented upwards, two support faces which are substantially planar and inclined relative to each other, and a ridge line along which the two respective support faces are connected, the ridge line of each of the support elements intersecting the central axis of the three-dimensional support structure, being inclined with respect to the central axis of the three-dimensional support structure and extending upwardly up to the apex of the respective support element while getting away from the central axis of the three-dimensional support structure, and
   a plurality of photovoltaic coatings fastened to the three-dimensional support structure, each photovoltaic coating being arranged on a respective support face and extending substantially parallel to the respective support face, each photovoltaic coating comprising at least one photovoltaic cell and covering at least partially the respective support face.

2. The three-dimensional photovoltaic module according to claim 1, wherein the apices of the support elements are distributed around the central axis of the three-dimensional support structure.

3. The three-dimensional photovoltaic module according to claim 1, wherein the apices of the support elements are equidistant from the central axis of the three-dimensional support structure.

4. The three-dimensional photovoltaic module according to claim 1, wherein the ridge lines intersect at a point of intersection located substantially on the central axis of the three-dimensional support structure and configured to be located below the apices.

5. The three-dimensional photovoltaic module according to claim 1, wherein each of the ridge lines is inclined with respect to the central axis by an angle of inclination comprised between 1° and 40°.

6. The three-dimensional photovoltaic module according to claim 1, wherein each of the support faces has a generally triangular shape.

7. The three-dimensional photovoltaic module according to claim 1, wherein the number of support elements is comprised between 3 and 6.

8. The three-dimensional photovoltaic module according to claim 1, wherein the two support faces of each support element are symmetrical with respect to a respective plane of symmetry passing through the respective ridge line.

9. The three-dimensional photovoltaic module according to claim 8, wherein the planes of symmetry of the support elements intersect according to a line of intersection which is substantially coincident with the central axis of the three-dimensional support structure.

10. The three-dimensional photovoltaic module according to claim 1, which further includes a base which is located below the three-dimensional support structure and which defines, at least in part, an inner housing in which electrically-conductive wires, connected to the photovoltaic coatings, are at least partially housed.

11. The three-dimensional photovoltaic module according to claim 10, wherein the base has a polygonal shape.

12. The three-dimensional photovoltaic module according to claim 1, which includes a protective cap which covers the photovoltaic coatings, the protective cap being made of a material transparent to light radiation.

13. The three-dimensional photovoltaic module according to claim 1, which includes an antireflective surface coating arranged on an upper face of the protective cap.

14. A photovoltaic device including a plurality of three-dimensional photovoltaic modules according to claim 1, said three-dimensional photovoltaic modules being arranged adjacently.

\* \* \* \* \*